_United States Patent_ [19]

Collins et al.

[11] 3,942,175

[45] Mar. 2, 1976

[54] MULTIPURPOSE KEYBOARD SYSTEM

[75] Inventors: Don E. Collins, Kernersville, N.C.;
John F. Turner, Fullerton, Calif.

[73] Assignee: The United States of America as represented by the Secretary of the Air Force, Washington, D.C.

[22] Filed: Mar. 27, 1975

[21] Appl. No.: 563,004

[52] U.S. Cl. .......................... 340/365 R; 340/347 R
[51] Int. Cl.² ............................................ G08C 9/00
[58] Field of Search ........... 340/365 R; 235/156 EM

[56] References Cited
UNITED STATES PATENTS

| | | | |
|---|---|---|---|
| 3,220,000 | 11/1965 | Lesage | 340/365 R |
| 3,361,875 | 1/1968 | Banfalve | 340/365 R |

*Primary Examiner*—Thomas B. Habecker
*Attorney, Agent, or Firm*—Joseph E. Rusz; Julian L. Siegel

[57] ABSTRACT

A system for varying the function of a keyboard using a plurality of status keys to select a function. The status keys form a binary which are decoded in a first word decoder forming a single word which are fed to a plurality of binary decoders one each associated with one of the information keys on the keyboard for controlling the readout thereof. The information keys are also switches that activate a word encoder for producing a final output. A comparator gate can be interposed between the word encoder and the selection switches of the information keys, the gate being enabled by the first word decoder. The decoded word originating from the status keys also feed a segment decoder which activates segments surrounding selected information key elements.

3 Claims, 13 Drawing Figures

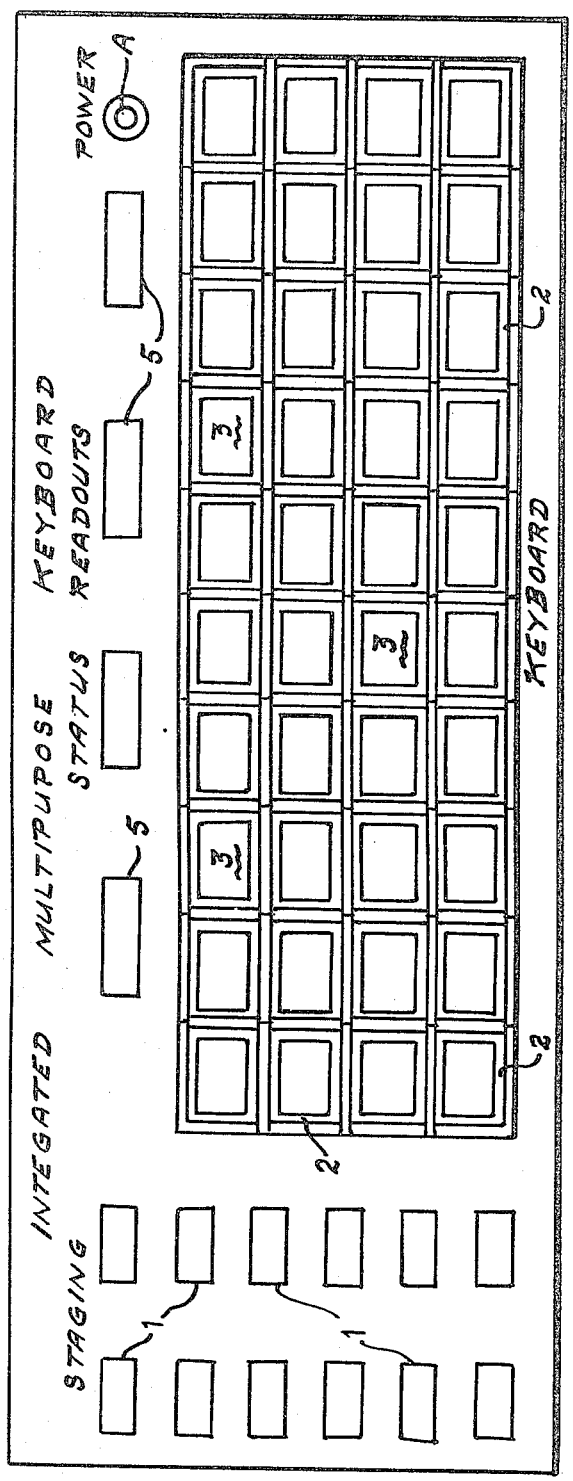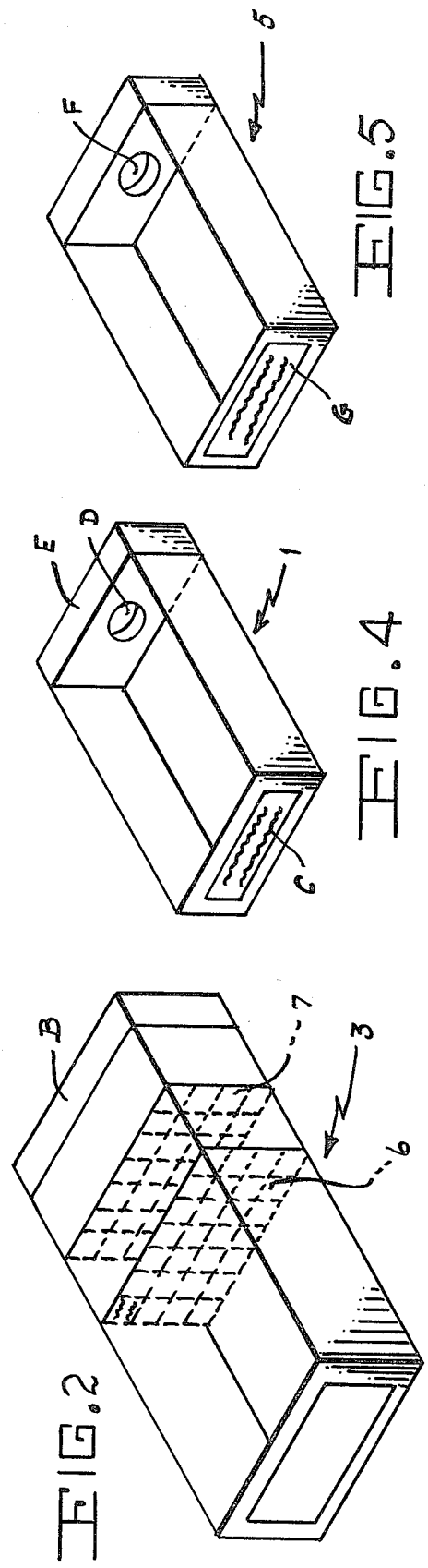

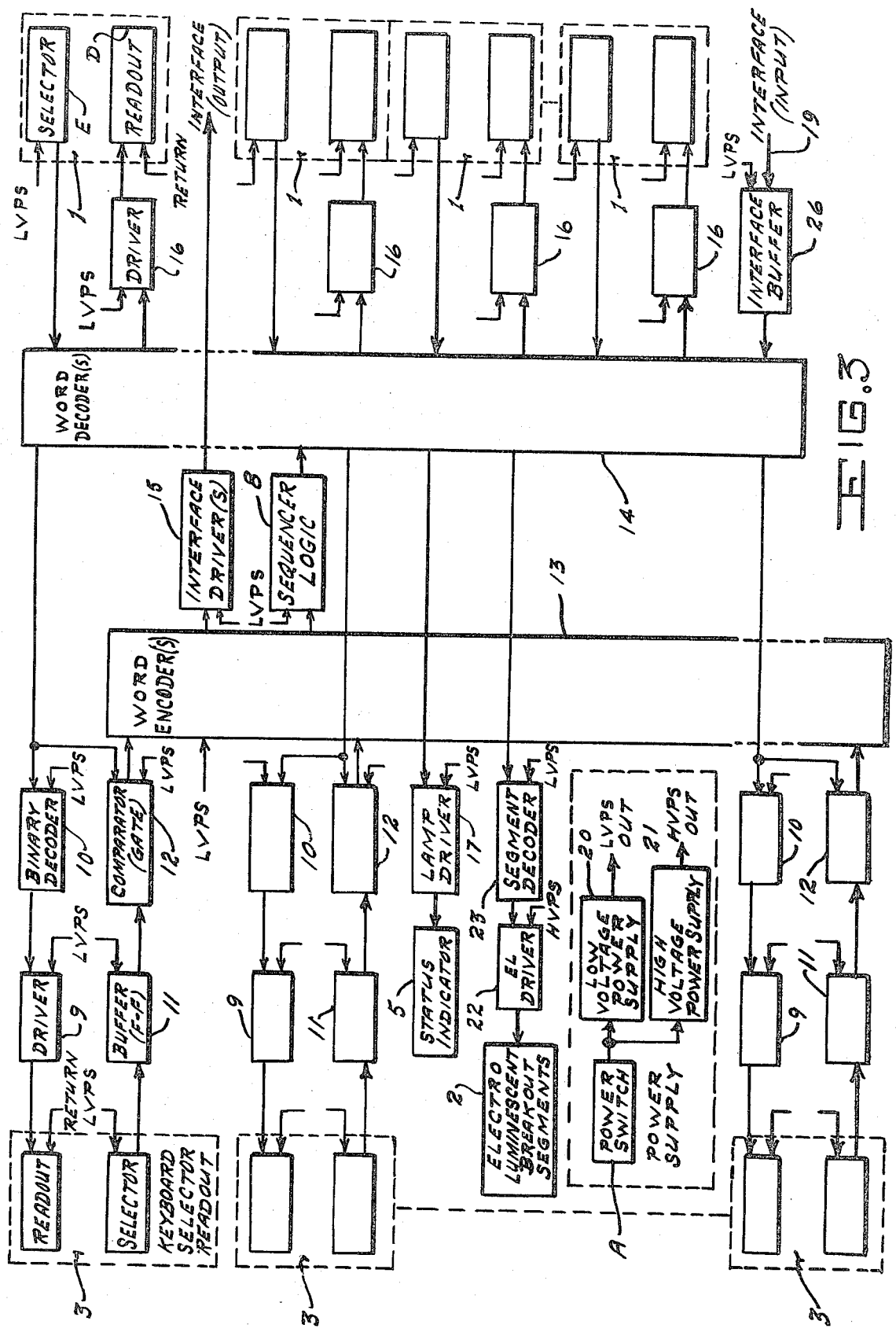

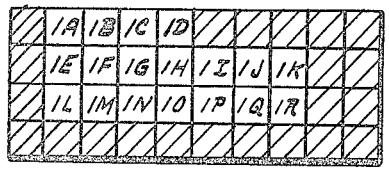
FIG.6a
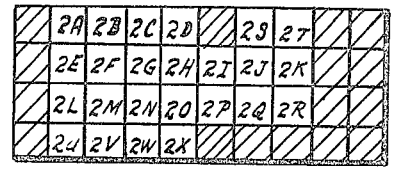
FIG.6b
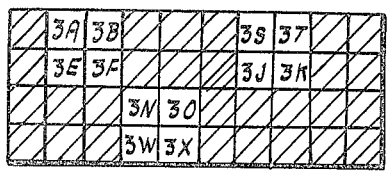
FIG.6c
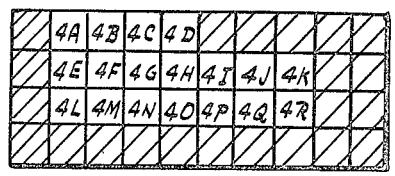
FIG.6d
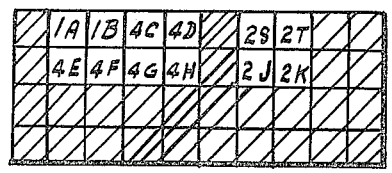
FIG.6e
FIG.7a
FIG.7b
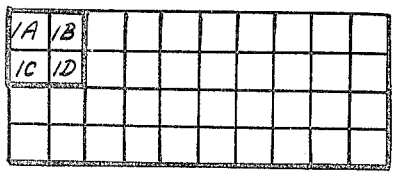
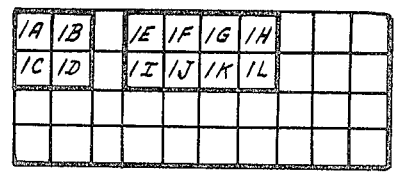
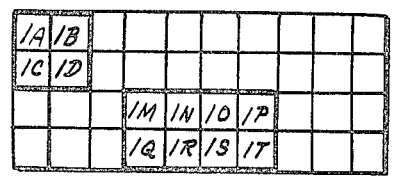
FIG.7c

MULTIPURPOSE KEYBOARD SYSTEM

STATEMENT OF GOVERNMENT INTEREST

The invention described herein may be manufactured and used by or for the Government for governmental purposes without the payment of any royalty thereon.

BACKGROUND OF THE INVENTION

This invention relates to processing, coding, and/or interpretation of manually initiated commands, and more particularly to a multi-keyed input/output device.

The function to be performed is to provide a category-, function-, or purpose-oriented keyboard system that serves as the man-machine interface to a complex data information-handling system. Further, it is to provide a selectable input/output organization peculiar to the category, function, purpose, etc.

The prior art consists of very limited display repertoires associated with the keyboard selectors. The system of selector configurations is also very limited. E.g., typical keyboards, for computers, and the like, consist of alphanumeric character selectors that can be depressed (or otherwise actuated). These keyboards provide full capability but it requires a number of selections before anything meaningful or readable has been selected.

A second major limitation is that the numbers of distinct selections is limited to the total number of selectors in the keyboard matrix. E.g., most keyboards include the alphabetical selectors A through Z (26 selectors), the numeric selectors 0 through 9 (10 selectors), and a few special selectors (varying from 4 to 8 usually).

This invention provides the uniqueness of multiple display messages for each keyboard selector/readout, thereby providing N times the total number of actual selectors/readouts as the total number of functional selectors/readouts; where N is the number of readout messages available for a given selector/readout.

Another feature is that this invention provides a mass readout selection capability for all (or part) of the selector/readouts based on some other singular selection. That is, a staging button can be selected, thereby setting up each selector/readout in the keyboard for a function related to the staging button.

Still another feature is that this invention reduces the error normally associated with the readout and selection of functions not directly associated with a task. The reduction of error is attributed to three things: (1) built-in logic to inhibit or prohibit actuations not associated with preselected requirements; (2) provision of readout messages not requiring interpretation to understand their functional relationship to the task at hand; and (3) sequential illumination feature provides the means whereby the initial staging of the keyboard illuminates/activates a small group of selectors/readouts and subsequent selection of one of them, then illuminates/activates a second group, and so on, until all selections in a sequence have been completed.)

SUMMARY OF THE INVENTION

The invention, as herein embodied, includes a keyboard (or keys) with integrated readouts incorporated as part of the keys; staging keys with integrated readouts as part of the keys (optional), encoding and decoding electronics for the readouts and key inputs; power supplies for the electronics, and a mechanical assembly for housing the keyboard (keys), readouts, electronics, and power supplies. An alternate to this invention can exclude the power supply and use an external electronic power source. Another alternate to this invention is the addition of segmented electroluminescent materials around each key of the keyboard to enable staging and subsequent lighting of these sections to "set off" groups of the keys of the keyboard. There is also an electrical interface for providing a coded or direct output to another device that uses electrical signals from this invention. In addition, this invention can receive primary or secondary commands from external devices via an electrical interface.

For standardization, the invention uses (but is not necessarily limited to) binary (two-state) mechanically actuated push-to-actuate buttons (normally momentary pushbutton switches) to provide a manually selected output upon actuation. The buttons (switches) are an integral unit with a selectable multi-state readout device (alphanumeric/character readout device) such that a button is illuminated or lighted to inform the operator (user) as to the specific interpretation of the button being actuated at a particular time. The keyboard button indicators are staged (programmed) for a specific meaning by the actuation (or selection) of a separate set of manually actuated (selected) actuators (switches). The actuators that stage the keyboard buttons (indicators) are decoded (or encoded) to interface with the multi-state readout device (keyboard button indicators). The same staging process can stage the electroluminescent sections that surround the keyboard buttons (optional capability). The staging actuators are normally part of the invention but can be remote and interfaced with the invention. The output of the keyboard button is an electronic binary signal (binary level output) that is provided as an output of the invention for use as an input to other devices. The output is normally coded with the staging button to indicate which readout state it is associated with, but it can be provided as a distinct output by itself and can be interpreted by the device using the signal. Driver and decoder/encoder electronics are used with the readouts, keyboard buttons, and staging buttons to provide signal conditioning and buffering for proper operation. A power supply (or power supplies) is either provided internally to the invention or externally to furnish power to the electronics. The mechanical assembly provides a chassis for housing the mechanical and electrical units and a guide for guaranteeing proper mechanical actuation of the keyboard and staging buttons.

One object of this invention is to provide a multipurpose keyboard as an input or input/output device for on-line or off-line man-machine systems.

Another object of this invention is to provide sets of alphanumeric and special characters for different modes of operation, thereby reducing error rates associated with limited alphanumeric keyboards.

Other objects and features of this invention will become apparent from the following description when read in conjunction with the accompanying drawings in which:

DESCRIPTION OF DRAWINGS

FIG. 1 is a panel layout for the multipurpose keyboard;

FIG. 2 is an isometric view of one of the keyboard pushbutton indicators shown in FIG. 1;

FIG. 3 is a block diagram of the total system electronics;

FIG. 4 is an isometric view of one of the staging buttons;

FIG. 5 is an isometric view of one of the status indicators;

FIGS. 6a – 6e are pictorials of the keyboard selectors/readouts showing five conditions of staged readouts; and FIGS. 7a – 7c are pictorials of the keyboard selectors/readouts showing three conditions of sequenced readouts.

DETAILED DESCRIPTION OF THE PREFERRED EMBODIMENTS

Referring to FIG. 1, the general layout of the invention is shown. Selectors/readouts 3 are arranged in a predetermined fashion, generally a meaningful format, depending upon the users specific requirements. The format is independent of the operation (i.e., in computer applications it would be likely that the format would be a 4 × 10 matrix as shown). Selectors/readouts 3 are equivalent to the standard alphanumeric keyboard but are not necessarily designated as such here. Staging selectors 1 provide a staging function in that their selection programs (sets) selectors/readouts 3 for a specific category, function, or purpose. Status readouts 5 provide status information regarding the overall operation of this unit (or possibly of the entire system). Switch A provides for normal ON-OFF (or STANDBY-OPERATE) functions. Electroluminescent segments 2 provide partitioning of selectors/readouts 3 by functional groupings.

FIG. 2 shows the details of a selector/readout 3. The selector/readout 3 incorporates selector B (momentary pushbutton, alternate action, light beam interrupter, etc., switch) with a readout 6 and 7 to provide an integrated selector/readout. Readout 6 and 7 pictured is a rear-projected readout using selectable lamp array 7 that projects through an area of a film chip 6. The film chip is provided with a matrix of messages enabling (functional) selection of any one of the N messages, where N is the total number of messages on the film chip. The readout could be mechanized as EL (electroluminescent), liquid crystal, or any other suitable device. Here it is shown as a lighted rear-projected readout assembly.

FIG. 4 shows the details of the staging selectors 1 which include ON-OFF switches E of the type described in FIG. 2. The selector also incorporates readout D (ON-OFF) that illuminates fixed (nonprogrammable) message C. As an option, this selector could be of the type described in FIG. 1 above, which would allow even greater flexibility.

FIG. 5 shows the details of status readouts 5 which include indicators F with fixed messages G. As an option, this readout could be of the type described in FIG. 1 which would allow even greater flexibility.

FIG. 3 shows the details of the functional block diagram of an embodiment of the invention. Lamp drivers 9, 16, and 17 provide buffering and power for the associated readouts. Buffer 11 provides buffering and/or FF memory for selector switch B. Comparator 12 provides a gated control of the output to the word encoder 13 (preventing false signal inputs). Binary decoder 10 provides decoding of word decoder 13 into a singular command for illuminating single readouts of readouts/selectors 3 (e.g., a BCD to 10 line decoder — decodes BCD inputs into 10 line outputs). Word encoder 13 takes all inputs from the readout/selector 3 sources and converts them into one or more binary words depending upon the size of the keyboard. Word decoder 14 takes all the inputs from the staging selectors 1 and/or external inputs and decodes them into coded inputs for readouts/selectors 3 (e.g., word decoder 14 may convert the total of the inputs into various BCD output lines). Interface driver 15 provides for a buffered output of the binary words for the interface (to the computer or peripheral equipment). Segment decoder 23 decodes the word decoder 14 to provide logic controls for electroluminescent readouts 2. The EL driver 22 provides high voltage signal conditioning for the electroluminescent readouts. Sequencer logic 8 enables sequential gating to enable sequential illumination and activation of groups of selectors/readouts 3 on the keyboard.

Referring to FIGS. 1 and 3, the operation of the invention is shown. Power switch A is turned on providing low and high voltage power from sources 20 and 21 to all logic and driver circuits. Staging switch 1 is selected and actuated staging the keyboard for a particular function, category, or purpose, as well as illuminating the staging switch indicator D. Staging switches can be provided externally to the panel as remote selectors. Actuation of staging switch 1 provides commands to keyboard readouts/selectors 3 turning on the appropriate indicators as well as selecting appropriate E-L segments 2 for illumination. The particular readout of a set of available readouts for each readout/selector unit 3 is keyed to one or more staging buttons 1 and is selected accordingly. Also, the E-L segments are selected in a similar manner to provide blocking off of readouts/selectors per some predetermined scheme of grouping. Actuation of readouts/selectors 3, when gate 12 is ON, provides stored entry of commands to the word encoder 13. Subsequent actuation of an enter (one of the keyboard readouts/selectors) dumps the word through interface 15 and resets the keyboard and this completes the cycle.

An additional design feature includes sequencer logic that provides control such that higher level of readouts/selectors are illuminated (and comparator enabled) and subsequent selection provides control such that the next level of readouts/selectors are illuminated and comparators enables, etc. This sequencer logic is peculiar to each designed configuration.

Certain features are optional, e.g., it is not necessary to provide a comparator 12, sequencer logic 26, electroluminescent readout segments 23, high voltage power 25, auxiliary input 19, interface and status indicators 20. In addition, the driver circuits may or may not be included as an integral part of the readouts (or decoders) in the case of readout circuits or as part of the switches (or comparators) in the case of the switch circuits.

FIGS. 5a – 6e provide pictorials of the operation of staging the keyboard for different functions. FIG. 6a shows one set of selected readouts, FIG. 6b another set, and so on through FIGS. 6c, 6d and 6e. For any condition, it is impossible that any combinations of readouts can be illuminated.

FIGS. 7a – 7c provide pictorials of the sequential operation of the keyboard. FIG. 7a shows four indicators illuminated as the initial condition (the E-L segments around them have been turned on to accentuate this condition). FIG. 7b shows the original four indicators illuminated plus eight additional ones. Again, the E-L segments have been turned on to accentuate this condition. FIG. 7c shows the original four indicators illuminated but with eight new ones. Again, the E-L segments have been illuminated to accentuate this condition. This display from condition 1 to 2 and 3 has exemplified staging of indicators. In FIG. 1a a group of selectors were illuminated and depressing one of these has staged the next set of selectors. This process continues until all selections have been completed and a selector/readout is illuminated. Depressing this initiates the data transfer and resets the keyboard.

What is claimed is:

1. A system for varying the function of a keyboard comprising:
   a. a plurality of means for selecting a keyboard function, each of the keyboard function selecting means including an activating switch and an indicator with the collective outputs of the function selecting means forming a coded binary word;
   b. means for decoding the coded binary word formed by the outputs of the function selecting means;
   c. a plurality of binary decoders fed by the word decoding means to form a plurality of single commands;
   d. a plurality of information keys each including a selector switch and an indicator with the indicators being fed by one each of the plurality of binary decoders; and
   e. a word encoder fed by the selector switches of the plurality of information keys for converting the outputs thereof into a single binary word representing the output of the keyboard system.

2. A system for varying the function of a keyboard according to claim 1 which further comprises a plurality of comparator circuits interposed between the word encoder and one each of the selector switches of the plurality of information keys and gated by the output of the word decoding means.

3. A system for varying the function of a keyboard according to claim 2 which further comprises:
   a. a plurality of electroluminescent segments surrounding preselected information keys; and
   b. a segment decoder interposed between the binary decoder means and the plurality of electroluminescent segments.

\* \* \* \* \*